United States Patent
Safabakhsh et al.

[19]

[11] Patent Number: 5,909,837
[45] Date of Patent: Jun. 8, 1999

[54] CONTACTLESS BONDING TOOL HEATER

[75] Inventors: Ali Reza Safabakhsh, Yardley; John Joseph Kilgarriff, Norristown, both of Pa.

[73] Assignee: Quad Systems Corporation, Willow Grove, Pa.

[21] Appl. No.: 08/853,877

[22] Filed: May 9, 1997

[51] Int. Cl.[6] .......................... B23K 1/005; B32B 31/20; B32B 31/26

[52] U.S. Cl. .......................... 228/6.2; 228/9; 219/85.12; 156/380.9

[58] Field of Search ................. 228/6.2, 9, 49.5; 156/380.9; 219/85.12

[56] References Cited

U.S. PATENT DOCUMENTS

| 5,598,965 | 2/1997 | Scheu | 228/6.2 |
| 5,667,129 | 9/1997 | Morita et al. | 228/9 |

FOREIGN PATENT DOCUMENTS

| 0002884 | 7/1979 | European Pat. Off. | 228/6.2 |
| 4-151844 | 5/1992 | Japan | 219/85.12 |
| 5-205852 | 8/1993 | Japan | 219/85.12 |

*Primary Examiner*—Patrick Ryan
*Assistant Examiner*—Jeffrey T. Knapp
*Attorney, Agent, or Firm*—John B. Sowell

[57] ABSTRACT

In a pick and place machine of the type having an X-Y movable bond head there is provided a vertically movable pick up tool in the bond head having a tip for picking up and placing a device. The tip of the bonding tool is mounted opposite a radiant heating element which is juxtaposed and separated from the tip of the bonding tool. The tip of the bonding tool is heated to a predetermined control temperature with the radiant energy heating element and during a bonding operation it incurs some cooling. The amount of cooling is calculated by the time and the length of the extension of the bonding tool from its heating element and a computer controller calculates a compensation factor over a predetermined fixed time which includes retracting the bonding tool tip a predetermined vertical distance into the heater to reheat the tool and compensate for the amount of cooling that occurred during the pick and place operation.

13 Claims, 7 Drawing Sheets

CONTACTLESS BONDING TOOL HEATER

BACKGROUND OF THE INVENTION

1. Field of the Invention

This invention relates to heated bonding tools. More particularly, the present invention relates to a novel heating element for a bonding tool which does not physically contact the bonding tool being heated.

2. Description of the Prior Art

Wire bonding and die bonding tools are well known in the semiconductor manufacturing art and have been classified in U.S. Class 219, subclasses 85 etc. and in Class 228, subclass 4.5 etc. Heretofore, such heated bonding tools fell into one of two general types. U.S. Pat. No. 3,641,304 illustrates a high efficiency heat block having a replaceable heating element mounted in the block and means for mounting die or wire bonding nibs onto the heat block. The heat block was made relatively large and was not insulated, thus, exposing machine operators to heat blocks whose temperature operated up to 700° C. When replacing tools or making critical adjustments, accidents could and would occur.

U.S. Pat. 4,315,128 illustrates another high efficiency heating bonding tool having a thin film heating element permanently attached to and made a part of the bonding tool. This tool was capable of being heated to 600° C. When the tool or the heater wore out, the tool was thrown away, thus, tools could be thrown away before their useful life was expended.

Both types of tools create a heat hazard to operators who must adjust and replace the tools during production. More importantly, neither type of prior art tool could be easily adapted for use on modern high speed pick and place machines. One of the features of such pick and place machines is that the die or component being placed on a substrate or lead frame needs to have its position sensed in X, Y and theta after being picked up so that small pick up errors could be corrected prior to placement. Some of the electrodes on components and semiconductor devices are so small that the misplacement by a few microns could easily result in unusable finished product.

It would be highly desirable to provide a novel bonding tool and bonding tool heater which would be completely compatible with the latest high speed pick and place machines which are adapted for accurately placing components and chips on substrates and lead frames.

SUMMARY OF THE INVENTION

It is a principal object of the present invention to provide a novel heated bonding head for heating a novel bonding tool.

It is a principal object of the present invention to provide a novel infrared heating element and a bonding head which heats a bonding tool with radiant energy without engaging the tool.

It is another principal object of the present invention to provide a thermally insulated bonding head which does not physically engage the bonding tool being heated.

It is a yet another object of the present invention to provide a novel radiant heater for a bonding tool which does not move with the bonding tool.

It is a general object of the present invention to provide a new and improved insulated heating system for a bonding tool.

It is another object of the present invention to provide a heater control system for maintaining the heating element at a predetermined desired temperature by computer means or by manual control override.

It is a another object of the present invention to provide a method and means for controlling the actual temperature of the bonding tool during bonding operations without the assistance of a sensor in a feedback loop.

According to these and other objects of the present invention, there is provided on a pick and place machine a transport system mounted for X and Y directional movements on the machine. A bonding head is mounted on the transport system and comprises a vertically moveable pick-up tool which is rotatable in the theta direction. A radiant heating element is fixedly mounted in the bonding head concentric to the pick-up tool and computer controls maintain the tip of the bonding tool at a predetermined temperature by transfer of radiant energy to the bonding tool.

DESCRIPTION OF THE PREFERRED EMBODIMENTS

Figure 1:
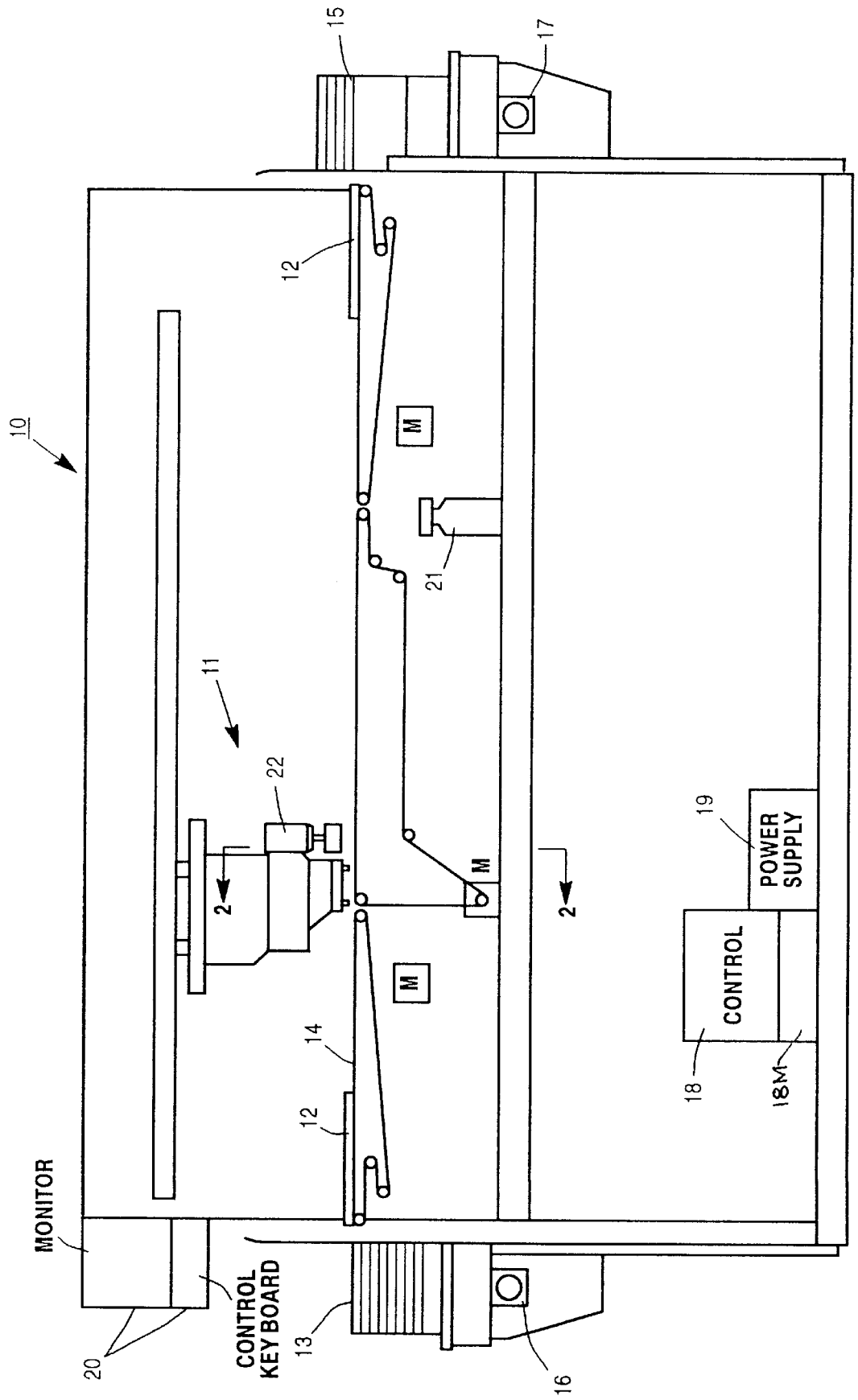
FIG. 1 is a front elevation in partial section of a pick and place machine showing a movable pick-up head.

Refer now to FIG. 1 showing a front view of a partial section of a pick and place machine 10. Such machines are well known and the machine depicted here for the present invention is similar to a model APS-1 made by Quad Systems Corporation of Willow Grove, Pa. Such machines are supplied with a bonding head 11 adapted to bond components and devices onto lead frames or substrates 12 which are supplied from a supply magazine 13 to a conveyor belt 14 which transfers them to the workstation and subsequently transfers them as bonded lead frames or substrates to the output or receiving magazine 15. Magazine 13 is supplied with an elevator motor 16 and output magazine 15 is supplied with an elevator motor 17. The conveyor belt may be supplied with a plurality of motors or a single motor shown by the designation M. Beneath the bonding head 11 and conveyor 14 which is usually covered by panels there are a number of electrical components such as a controller 18 and memory 18M which includes a plurality of different card racks for performing different functions such as coordinating the drive motors, the vision systems, the machine to motor interfaces and other software controls. Further, there is provided a power supply 19 which can be used for maintaining a preset temperature of the heater to be described hereinafter. The power supply is coupled to the controller and may also be manually controlled by the keyboard 20.

The normal mode of operation of the machine 10 is to first pick up a component or die to be placed on a substrate or lead frame 14. Assuming that the lead frame is properly registered at the workstation and the component is picked up, it is now necessary to determine the orientation and position of the component with a horizontal imaging system such as the system shown and described in Quad's U.S. Pat. No. 5,559,727 which is employed on the aforementioned model ASP-1 pick and place system. However, if the pick and place operation requires alignment with very small indicia (electrodes) on the die and on the substrate, then the position of such indicia on the die or component is preferably located by a lookup positioning recognition system (PRS) 21 and the pattern on the substrate is located by a look down PRS system 22 which is mounted on head 11. Thus, it will be understood that the machine illustrated is a general purpose machine. Normally, machines of the type illustrated are used for surface mounting, flip chip mounting, regular die mounting, regular component mounting, chip on board and chip on flex as well as other processors which require a reflow oven after the chip or component is placed on the substrate or lead frame. In the present invention to be described hereafter, a process referred to as micro ball grid array (BGA) requires that the precisely aligned indicia or electrodes on the component or die be aligned with similar indicia on the substrate or carrier and such precision will not permit the use of a reflow oven. Thus, it is necessary to precision place the component or die and at the same time facilitate curing of a thermal set adhesive by application of heat. A similar process is used for fast cure adhesive die bonding.

Figure 2:
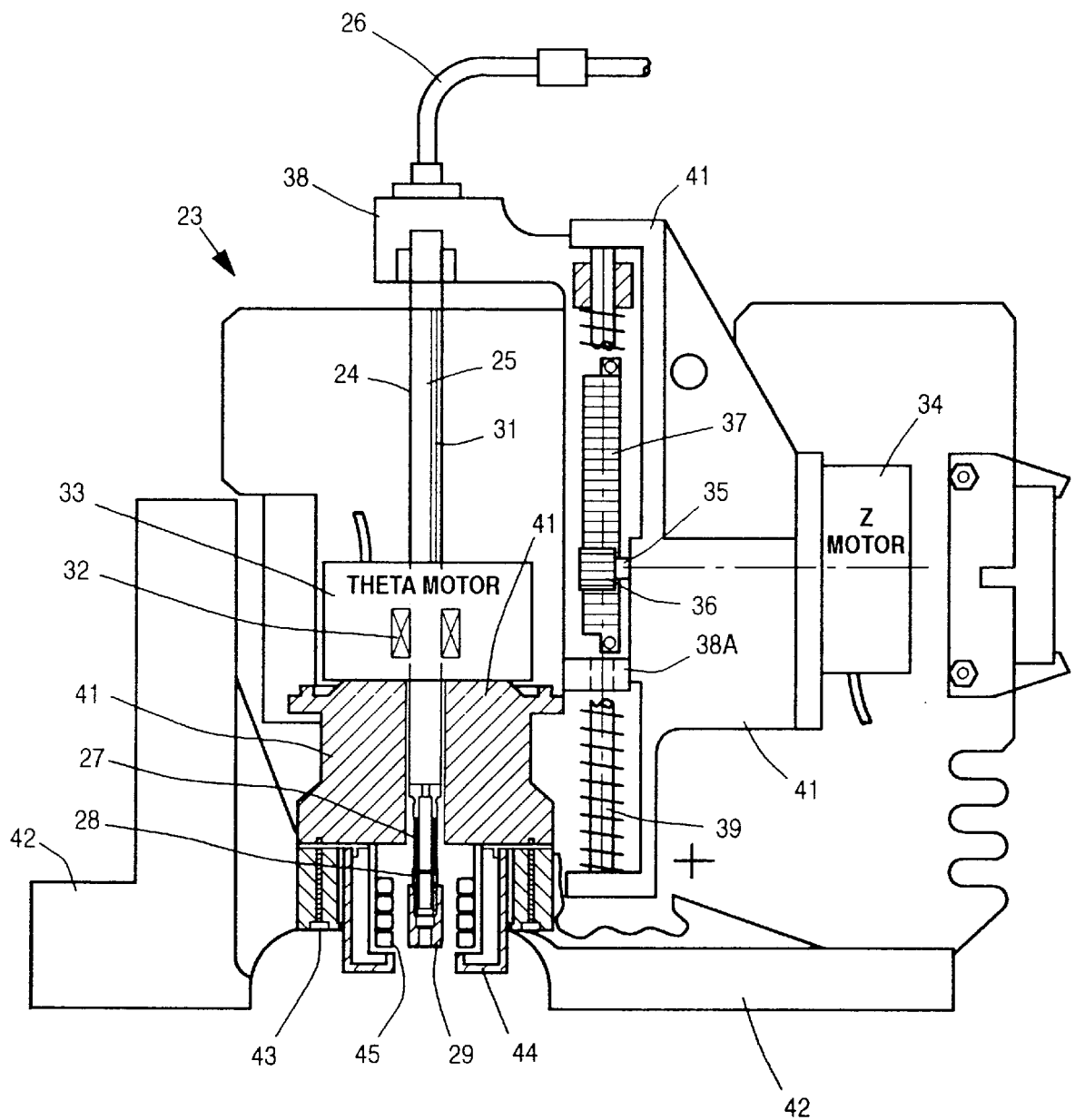
FIG. 2 is an elevation in partial section taken at lines 2—2 of FIG. 1 showing details of the present invention pick-up head.

Refer now to FIG. 2 showing an elevation view taken at lines 2—2 of FIG. 1 showing details of the present invention pick-up head and heater. The bonding tool 23 comprises a vertically moving shaft 24 which is provided with a bore or aperture 25 which connects to a vacuum source 26. Further, the lower end of the shaft 24 is physically connected to a bellows spring 27 which connects to a coupling 28 which engages into the bonding tip 29. This permits exchange of different types of bonding tips without replacement of the bonding tool. Further, the vertically moving shaft 24 is provided with a spline 31 which is engaged by the spline bearing 32 of the theta or rotational motor 33 which provides rotation of the shaft during vertical movement.

There is further provided a Z motor 34 which is mounted on a fixed frame 41 as part of the head 11. The Z motor is provided with a shaft 35 which rotates a pinion gear 36 that engages a rack 37 mounted on a Z frame 38. The Z frame 38 carries the vertically movable shaft 24. There is further provided a linear bearing 38A as part of the Z frame 38 which guides on a guide rod 39. Thus, it will be understood that the Z motor 34 can independently move frame 38 on guide rod 39 while the theta motor 33 is performing rotation of the shaft 24.

The stationary frame casting 41 also includes a support for the theta motor 33 through which the shaft 24 passes. This lower part of frame 41 is shown supporting the aforementioned QUADALIGN™ system 40 that is shown and described in U.S. Pat. No. 5,559,724 and is incorporated by reference herein. The long screws 43 which connect the Quadalign frame 42 to the fixed frame 41 also support a cylindrical surround insulator 44 which positions and supports the heating elements 45 juxtaposed the bonding tip 29.

Figure 3:
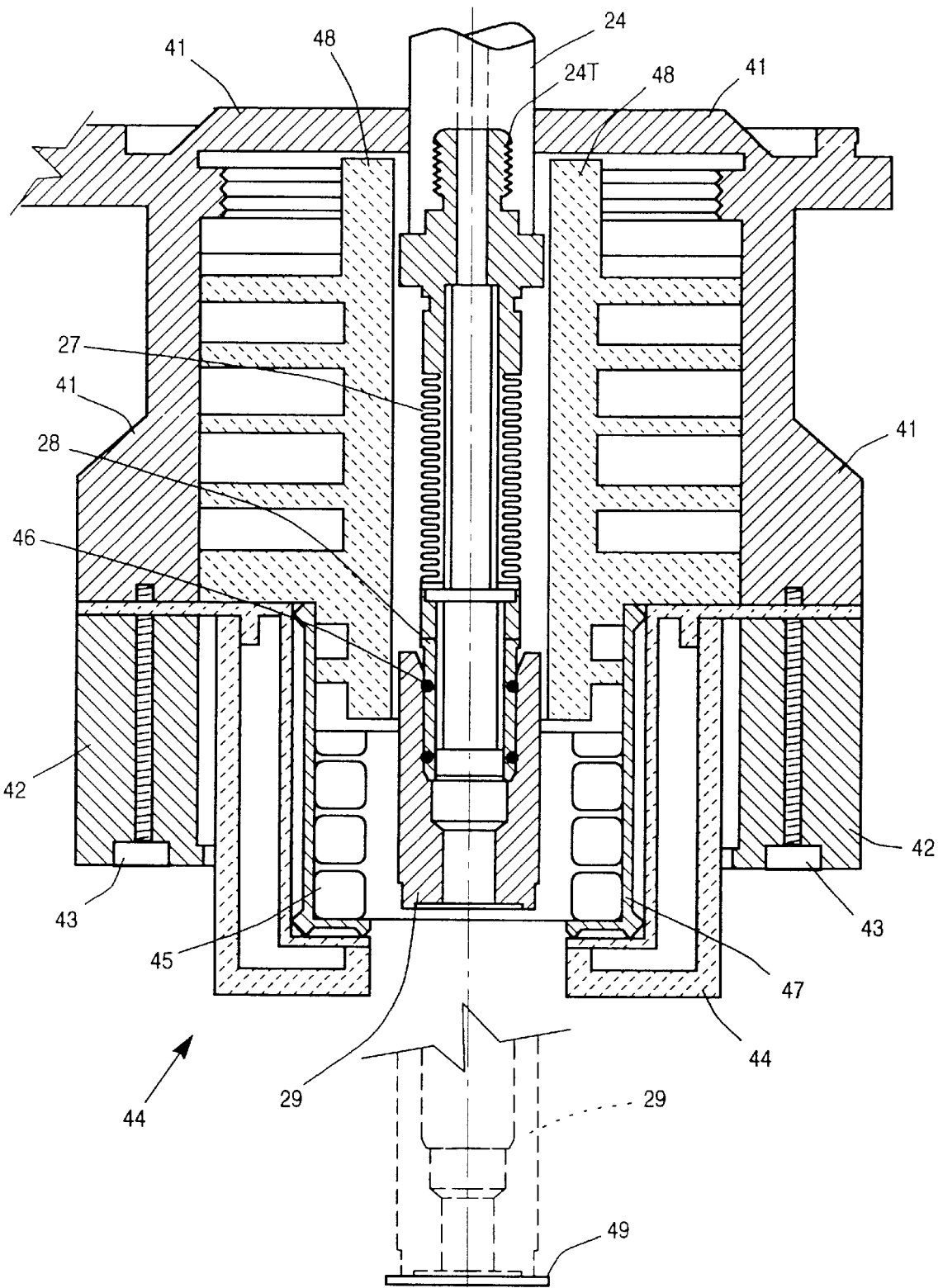
FIG. 3 is an enlarged elevation in section showing details of the novel radiant heater and heated pickup tool shown in FIG. 2.

Refer now to FIG. 3 showing an enlarged detailed elevation in section of the novel radiant heater and pick-up tool shown in FIG. 2.

The shaft 24 comprises an attached lower coupling portion which is threaded at 24T. The shaft 24 connects to the aforementioned spring bellows 27 which is attached to the coupling 28 of shaft 24 which fits into tool tip 29 and is held by high temperature O rings 46. The frame 41 forms a cylindrical surround and support for the motor 33. On this cylindrical portion, the Quadalign sensor 42 is shown held by long screws 43. A portion of the cylindrical surround insulator 44 is shaped as an annular disk and is also held against the frame 41 by the long screws 43. The cylindrical surround is preferably made from a high temperature insulation such as a reinforced fiber or filled fiber glass and is hollow to support a cup shaped member 47 which supports the heating elements 45 and permits expansion relative to the cylindrical surround 44. Inside of the hollow frame 41, there is also provided a hollow cylindrical insulating member 48 which prevents heat from the heating elements from driving into the frame 41, and the lower cylindrical insulating member 44 prevents heat from passing into the Quadalign system as well as creating a heat hazard. For purposes of illustrating, the tip 29 of the tool 24 is extended during a pick or place position as shown by tool 29 in phantom lines supporting a chip or component 49.

Figure 4:
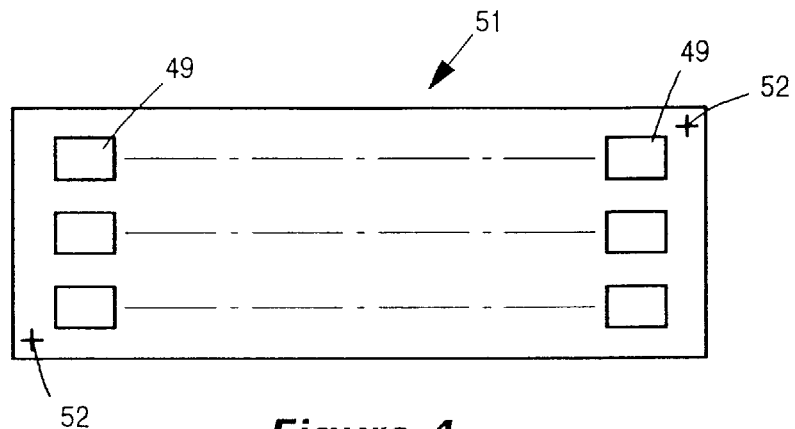
FIG. 4 is a schematic plan view of a lead frame or substrate of the type which may be loaded in magazines and transported to the pick-up head.

Refer now to FIG. 4 showing a schematic plan view of a lead frame 51 or substrate of the type which may be loaded in the magazines 13. The lead frame 51 is shown having two indicating marks 52 or eye points used for precise location of the frame 51 using a PRS camera system. Further, there are shown components arranged on the substrate after being placed on precise electrodes which are beneath the component and are not shown. It will be understood that the particular lead frame 51 may comprise a substrate of the type on which different components 49 are attached.

Figure 5:
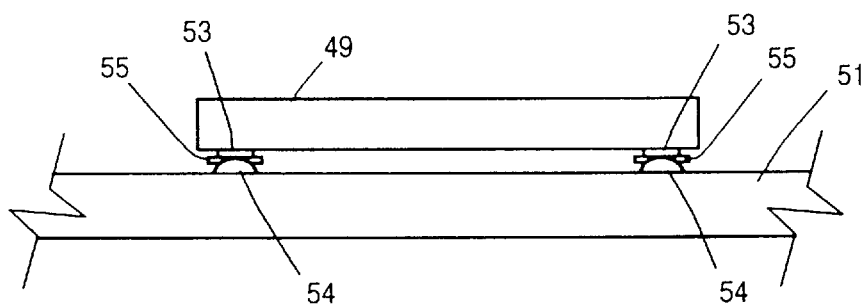
FIG. 5 is an enlarged schematic side view of a die or component to be surface mounted on a lead frame or substrate.

Refer now to FIG. 5 showing an enlarged schematic side view of a die or component 49 showing very small pads or electrodes 53 which must be attached to similar pads or electrodes on the substrate with exact precision. Such electrodes may be in the form of bumps or balls 54 which are provided with a thermoset adhesive 55 on the top of the ball. Thus, it will be understood that when the die or component 49 is heated to a proper predetermined temperature and pressed against the thermoset adhesive in precise alignment between electrodes 53 and 54 that the conductive adhesive 55 will permit the precise connection of electrodes 53 and 54 over the complete surface of the die.

Figure 6:
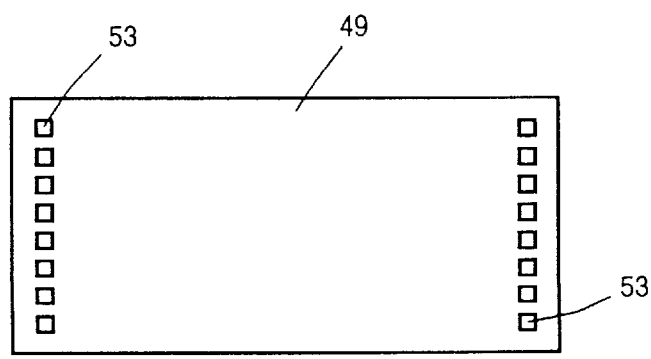
FIG. 6 is a plan view of the die or component shown in FIG. 5 having pads or electrodes which are to coincide with similar electrodes on a substrate or carrier when properly mounted thereon.

Refer now to FIG. 6 showing a plan view of the die or component 49 which has a plurality of pads or electrodes 53 which are to be aligned with a similar plurality of pads or electrodes 54 of the type shown in FIG. 5. Thus, it will be understood that employing the present invention it is possible to precisely align the electrodes of two components or devices with similar electrodes or devices on substrates or lead frames and be assured that the two are connected properly without being able to visually inspect the actual operation or the end result. Before referring to FIG. 7, it is to be understood that the tip 29 of the bonding tool serves as the heater for the devices or components 49 and that the only heat for the device or component is by conduction through the tip of the bonding tool 29. However, when the tip of the bonding tool is extended outside of the juxtaposed position of the heaters 45 which is shown in FIGS. 2 and 3, the tip 29 of the bonding tool 24 incurs cooling.

Figure 7:
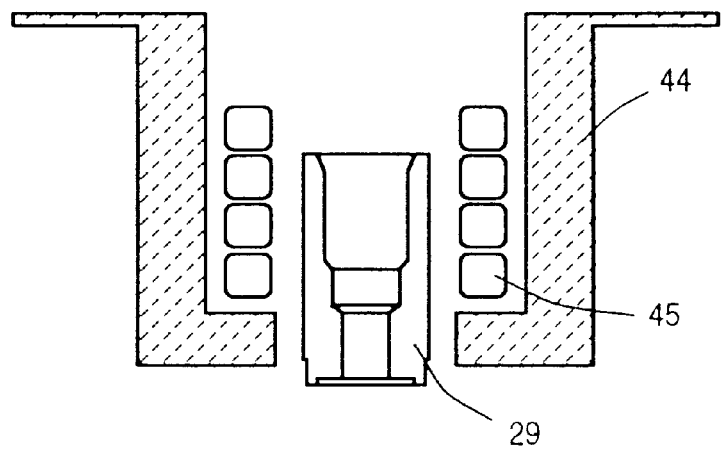
FIG. 7 is a schematic side elevation of the tip of a bonding tool in a neutral position relative to the heater.

Refer now to FIG. 7 showing a schematic side view of the tip 29 of the bonding tool 24 in a neutral position relative to the heaters 45. For purposes of this invention, the neutral position shown shall mean that extended position at which the tip of the tool 29 maintains a predetermined preset temperature relative to the heating coils 45.

Figure 8:
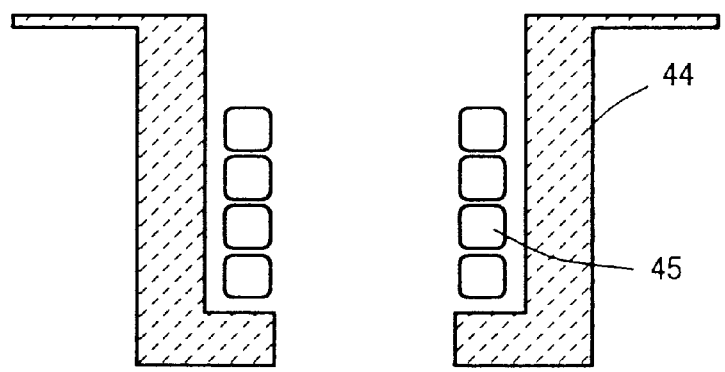
FIG. 8 is a schematic side view of a bonding tool with the tip extended in a pick or in place position relative to the heater.
Figure 8:
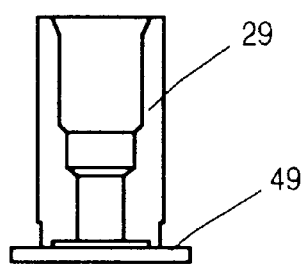

Refer now to FIG. 8, showing a schematic side elevation of the bonding tool 24 having a tip 29 which is extended into a pick or a place position relative to the heaters 45. It will be understood that the tip 29 is completely exposed into the atmosphere and is no longer undergoing heating so that cooling is occurring in the pick and place position.

Figure 9:
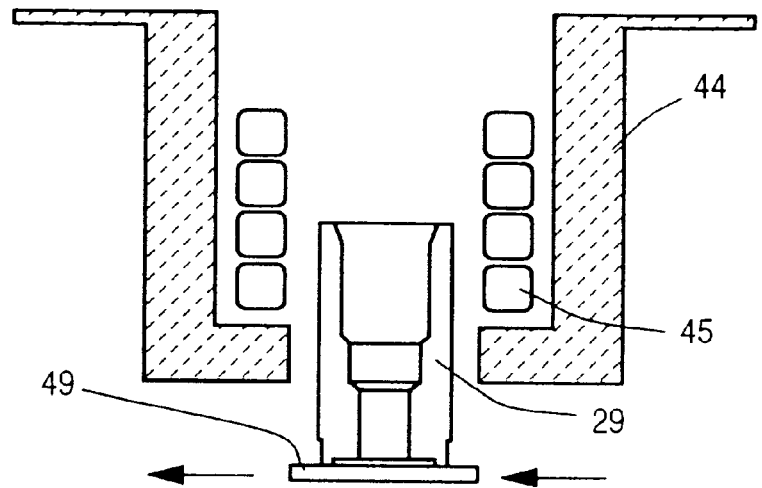
FIG. 9 is a schematic side view of a tip of a bonding tool slightly extended from the heater in a transfer or sensing position.

Refer now to FIG. 9, showing a schematic side elevation of the tip 29 of the bonding tool 24, which is slightly extended from the heater in a transfer or a sensing position. It will be understood that even in this location, some cooling is occurring.

Figure 10:
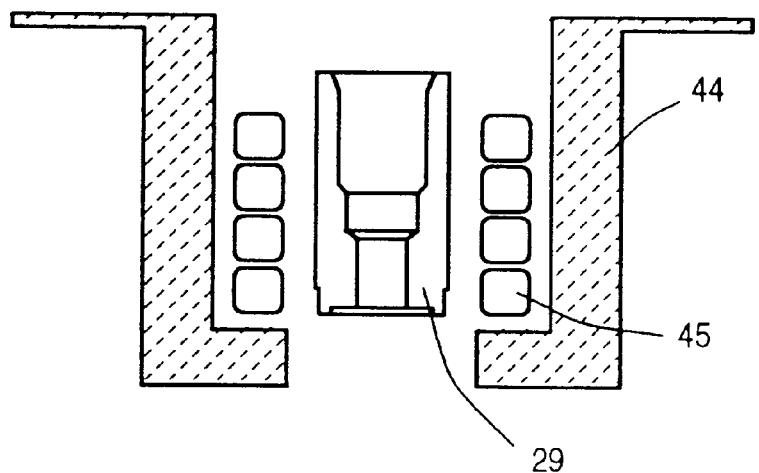
FIG. 10 is a schematic side view of a tip of a bonding tool in one of a plurality of retracted positions in the heater where reheating takes place.

Refer now to FIG. 10, showing a schematic side view of the tip 29 of the bonding tool 24, in one of the plurality of retracted positions into the heater system wherein reheating takes place.

Figure 11:
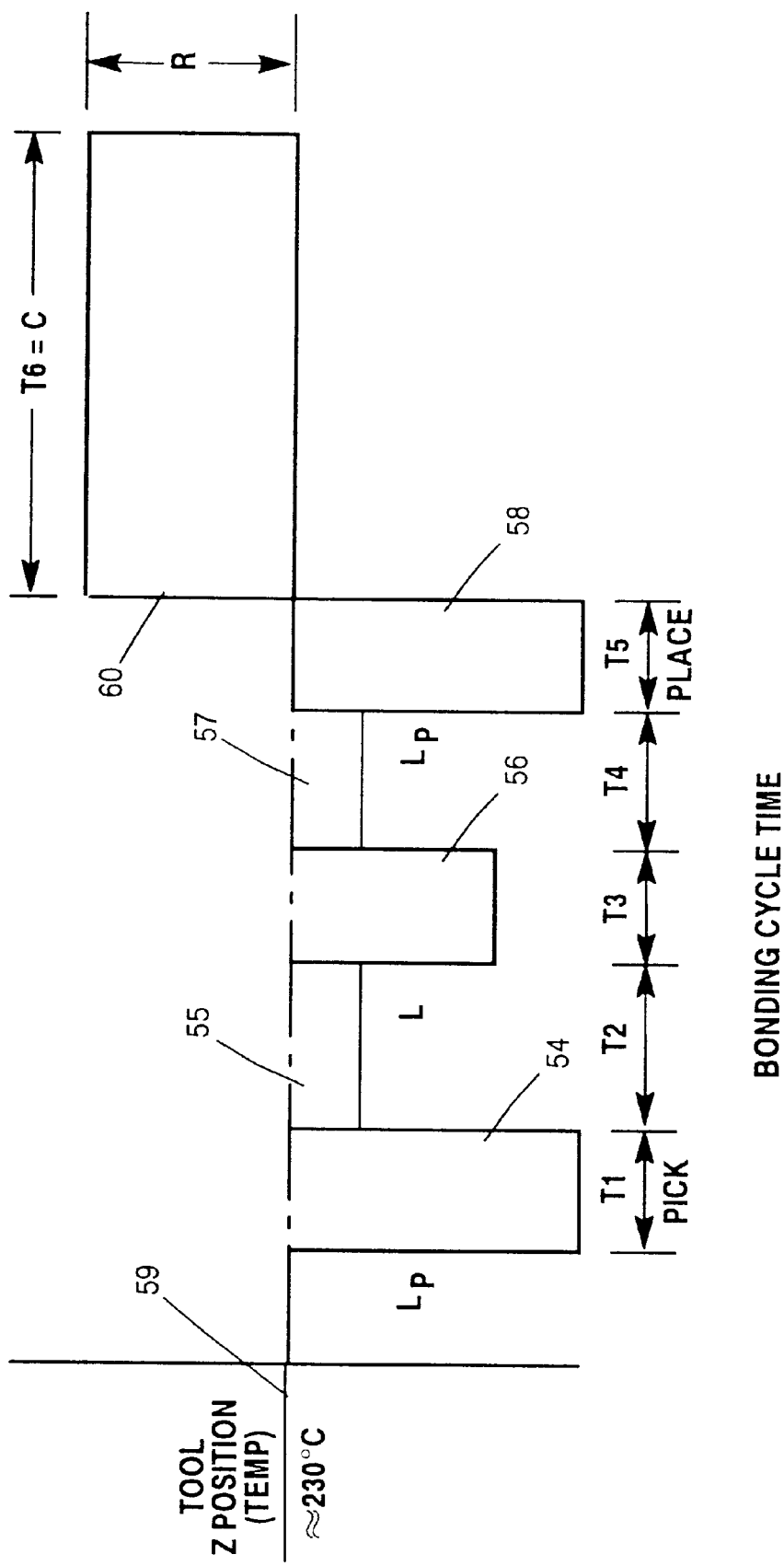
FIG. 11 is a schematic waveform diagram used to illustrate temperature correction and compensation to maintain a stabilized working tip temperature.

Refer now to FIG. 11 which is a schematic waveform diagram used to illustrate the controlled temperature correction and compensation which maintain a stabilized working tip temperature.

FIG. 11 is a plot of the position/temperature of the tip of the tool 29 versus time. When a pick and or a place operation occurs, the tool tip 29 extends downward the length $L_1$, for a duration T1, and it will be understood that the volume or area of this curve is related to a cooling factor which is predetermined. The waveform 54 represents the pick up of an element or device. The component is then transferred to a position for inspection over time T2. The transfer portion of the cooling curve is shown as 55. When the component is at the inspection position, it is moved downward L to the inspection position as illustrated by the waveform 56 over time T3 which has a different length L and a different time T3 than the previous curve 54.

In a similar manner, after inspecting and determining the position of the component or device on the end of the tip of the tool, the component is again transferred over time T4 to the placement position as shown by the transfer portion 57 of the curve. After reaching the placement position, the tool tip 29 is again extended downward $L_1$, over time T5 to place the component on the substrate as shown by waveform 58. It will be noted that the extension $L_1$, for placement may be as long as the extension for pick up position 54, but in most cases is shorter.

After placement of the component on the substrate, the tip of the tool 29 is retracted into the heater juxtaposed the heating element 45 and past the neutral zone 59 shown having a temperature of 230° C. for purposes of this illustration. Also for purposes of this illustration, assume that the time T6 for reheat will be constant. The computer controls 18 perform a calculation based on experimental and theoretical data to return the temperature of the tip 29 to the neutral original temperature of 230° C. By extending the tip of the tool further into the shroud of the heater, juxtaposed the heating elements 45. It has been found using experimental data that the position of the tool when retracted further into the heating element, heats faster. This experimental data can be placed on a curve in memory 18M so that the tool is properly reheated to its desired predetermined temperature.

Having explained a preferred embodiment of the present invention which includes a novel heating element 45 that supplies infrared radiation, or radiation heat in the infrared spectrum, it will be understood that the bonding tool tip 29 is preferably coated with a dark color finish which will stand the heat of radiation in the infrared spectrum, which in this case may be anywhere from 300° to 1300° C.

The neutral temperature may be recalibrated or checked on the fly by means of a precision thermocouple which is engaged by the bonding tool between a given number of substrates or time period.

The heated tip 29 may be employed in other processes when used on a pick and place machine. The machine can perform flip-chip bonding of die to a substrate as well as face up bonding of a die to a carrier or lead frame. The more difficult and precise operation described hereinbefore was for micro-BGA where very small electrode pads are electrically connected.

The different uses of the heated bonding tool tip extends beyond micro-BGA connections which eliminates the need for a reflow to make the electrical connections.

What is claimed is:

1. Apparatus for heating devices during placement, comprising:

a bonding head on an X-Y placement machine movable between a pick and a place position, a bonding tool mounted in said bonding head and movable in a vertical and a rotary direction, a heated tip on the end of said bonding tool for picking up a device at room temperature and heating it to a desired predetermined control temperature at the time of placement, and radiant heating means mounted on said bonding head separated from said heated tip for heating said heated tip to said desired predetermined control temperature prior to placement.

2. Apparatus as set forth in claim 1 which further includes control means coupled to said radiant heater means for maintaining said bonding tool tip at a predetermined elevated temperature above said desired control temperature.

3. Apparatus as set forth in claim 2 wherein said control means comprises memory means for recording the time and vertical position of said heated tip over a pick and place operation, and further includes means for calculating a reheat position for said heated tip to restore said heated to said predetermined control temperature after being cooled during a pick and place operation.

4. Apparatus for heating devices during placement, comprising:

a pick and place machine, a bond head on said pick and place machine movable in an X and a Y direction, a vacuum actuated pick-up tool mounted in said bond head movable in a vertical and a rotary direction, a radiant energy heater fixedly mounted in said bond head and spaced apart from said pick-up tool for heating the tip of the said pick-up tool.

5. Apparatus as set forth in claim 4 which further includes control means coupled to said radiant energy heater for setting a predetermined temperature.

6. Apparatus as set forth in claim 5 wherein said control means further includes means for setting a predetermined temperature for a component at a time of placement.

7. Apparatus as set forth in claim 5 wherein said control means further includes computer means for calculating a time-temperature adjustment value and for positioning a tip of said bonding tool to absorb heat over a predetermined time.

8. Apparatus as set forth in claim 7 wherein said calculating said time-temperature adjustment value comprises calculating the time the tip of the bonding tool is extended out of the bond head away from a neutral position.

9. Apparatus as set forth in claim 7 wherein said control means includes means for positioning the tip of the bonding tool inside of said bond head away from a neutral position according to said time-temperature adjustment value.

10. Apparatus as set forth in claim 4 wherein said tip of said pick-up tool comprises means for enhancing the transfer of radiant heat from said heater to said tip.

11. Apparatus as set forth in claim 10 wherein said means for enhancing the transfer of radiant heat comprises a surface having a high coefficient of absorption.

12. Apparatus as set forth in claim 11 wherein said surface comprises a dark color for efficient absorption of energy in the infrared spectrum.

13. Apparatus as set forth in claim 12 wherein said radiant energy heater is heated to a temperature between 300° and 1300° C. for emitting energy in the infrared spectrum.

\* \* \* \* \*